(12) United States Patent  (10) Patent No.: US 8,294,020 B2
Mitchell et al.  (45) Date of Patent: Oct. 23, 2012

(54) ENERGY HARVESTING DEVICES

(75) Inventors: Bradley J. Mitchell, Snohomish, WA (US); Trevor M. Laib, Woodinville, WA (US)

(73) Assignee: The Boeing Company, Chicago, IL (US)

( * ) Notice: Subject to any disclaimer, the term of this patent is extended or adjusted under 35 U.S.C. 154(b) by 1063 days.

(21) Appl. No.: 11/684,279

(22) Filed: Mar. 9, 2007

(65) Prior Publication Data

US 2008/0066796 A1 Mar. 20, 2008

Related U.S. Application Data

(63) Continuation-in-part of application No. 11/522,276, filed on Sep. 15, 2006, now Pat. No. 7,488,888.

(51) Int. Cl.
*H01L 35/00* (2006.01)
*H01L 37/00* (2006.01)

(52) U.S. Cl. ........ 136/200; 244/119; 136/203; 136/205; 136/230

(58) Field of Classification Search .......... 136/200–242; 244/119, 126; 29/897.2; 454/71, 76
See application file for complete search history.

(56) References Cited

U.S. PATENT DOCUMENTS

| | | | |
|---|---|---|---|
| 5,554,819 A | 9/1996 | Baghai-Kermani | |
| 6,053,063 A | 4/2000 | Oetjen | |
| 6,150,601 A * | 11/2000 | Schnatzmeyer et al. | 136/201 |
| 6,894,460 B2 | 5/2005 | Clingman | |
| 6,994,762 B2 | 2/2006 | Clingman et al. | |
| 2005/0022619 A1 | 2/2005 | Clingman et al. | |
| 2006/0154617 A1 | 7/2006 | Clingman et al. | |
| 2006/0175937 A1 | 8/2006 | Clingman et al. | |
| 2006/0266402 A1 | 11/2006 | Zhang et al. | |
| 2006/0266403 A1 * | 11/2006 | Hiller | 136/205 |
| 2008/0092354 A1 | 4/2008 | Clingman et al. | |
| 2008/0100178 A1 | 5/2008 | Clingman | |
| 2008/0100180 A1 | 5/2008 | Clingman et al. | |
| 2008/0100181 A1 | 5/2008 | Clingman et al. | |
| 2008/0150396 A1 | 6/2008 | Clingman et al. | |
| 2008/0160395 A1 | 7/2008 | Okada et al. | |

FOREIGN PATENT DOCUMENTS

| | | |
|---|---|---|
| EP | 1001471 A1 | 5/2000 |
| GB | 2140206 | 11/1984 |
| GB | 2320733 | 7/1998 |
| WO | WO 01/61768 A1 | 8/2001 |
| WO | WO 2007049006 A1 * | 5/2007 |

* cited by examiner

*Primary Examiner* — Kaj K Olsen
*Assistant Examiner* — Kourtney R Carlson
(74) *Attorney, Agent, or Firm* — Parsons Behle & Latimer

(57) ABSTRACT

Energy harvesting devices, wherein one illustrative embodiment includes a crease beam, a thermoelectric element disposed in thermally-conductive contact with the crease beam and a heat exchanger disposed in thermally-conductive contact with the thermoelectric element. An energy harvesting system and a method of harvesting electrical power are also disclosed.

20 Claims, 3 Drawing Sheets

ENERGY HARVESTING DEVICES

CROSS-REFERENCES TO RELATED APPLICATIONS

This application is a continuation-in-part application which claims the benefit of U.S. patent application Ser. No. 11/522,276, filed Sep. 15, 2006 now U.S. Pat. No. 7,488,888, and entitled "Energy Harvesting Devices".

The present invention relates to energy harvesting devices. More particularly, the present invention relates to thermoelectric energy harvesting devices which generate electrical power from thermal gradients.

BACKGROUND OF THE INVENTION

Energy harvesting devices generate electrical power from energy sources that are often overlooked and untapped. Examples of energy sources and methods to convert electricity include photovoltaic devices which convert light energy into electricity, cantilevered piezoelectric beams which convert vibrational energy into electricity and thermoelectric devices which convert heat flow into electricity. These energy harvesting devices and methods are amenable to a variety of applications.

As low power electronics become increasingly prevalent, energy harvesting devices and methods provide a useful way to power electronic devices without the need for batteries or electrical wiring. Electrical wiring is undesirable in many applications due to its cost to design and install, as well as its weight and difficulty to retrofit. Batteries are undesirable on airplanes due to the difficulty of replacement and because some batteries pose environmental or safety hazards. Additionally, batteries typically function poorly in low temperatures. In some cases, electronic devices that occasionally require medium quantities of electrical power may be powered using low-power energy harvesting devices. In these cases, electrical energy generated by energy harvesting devices is stored in a capacitor or rechargeable battery.

SUMMARY

The present invention is generally directed to energy harvesting devices. An illustrative embodiment of the energy harvesting devices includes a stringer clip, a thermoelectric element disposed in thermally-conductive contact with the stringer clip and a heat exchanger disposed in thermally-conductive contact with the thermoelectric element.

The present invention is further generally directed to an energy harvesting system. An illustrative embodiment of the energy harvesting system includes an aircraft wall having an interior cabin wall portion, an exterior aircraft skin portion spaced-apart with respect to the interior cabin wall portion and a wall interior between the interior cabin wall portion and the exterior aircraft skin portion; a return air vent provided in the interior cabin wall portion; a stringer clip; a thermoelectric element disposed in thermally-conductive contact with the stringer clip; and a heat exchanger disposed in thermally-conductive contact with the thermoelectric element and in pneumatic communication with the return air vent.

The present invention is further generally directed to a method of harvesting electrical power. The method includes providing an aircraft wall having an interior cabin wall portion, an exterior aircraft skin portion spaced-apart with respect to the interior cabin wall portion, a wall interior between the interior cabin wall portion and the exterior aircraft skin portion and at least one return air vent provided in the interior cabin wall portion; providing a heat exchanger in pneumatic communication with the at least one return air vent; providing a thermoelectric element in thermally-conductive contact with the heat exchanger; and providing a stringer clip in thermally-conductive contact with the thermoelectric element and the exterior aircraft skin portion of the aircraft wall.

BRIEF DESCRIPTION OF THE DRAWINGS

The invention will now be described, by way of example, with reference to the accompanying drawings, in which.

DETAILED DESCRIPTION OF THE INVENTION

Figure 1:
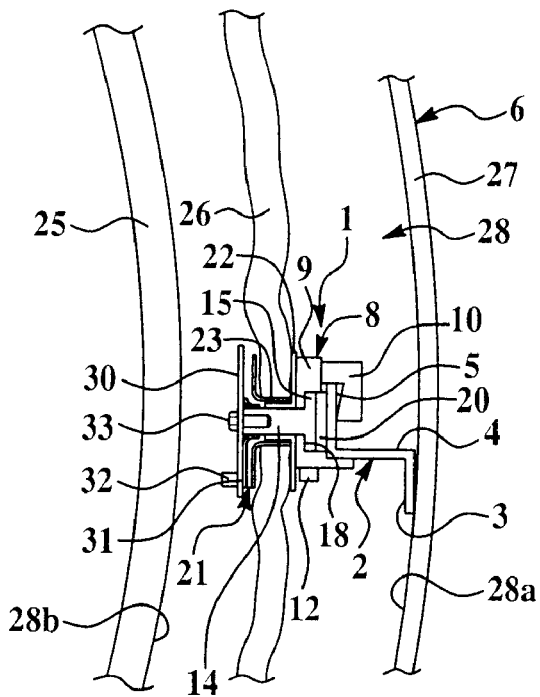
FIG. 1 is a cross-section of a wall portion of an aircraft, with an energy harvesting stringer clip attached to an insulation blanket in an illustrative application the energy harvesting devices.

Referring initially to FIGS. 1-4, an illustrative energy harvesting stringer clip embodiment of the energy harvesting devices is generally indicated by reference numeral 1. The energy harvesting stringer clip 1 is adapted to generate electrical power from a thermal differential or gradient which exists inside an aircraft wall 6 of an aircraft typically during the cruising phase of aircraft flight. Generally, the aircraft wall 6 includes an interior panel 25, an outer aircraft skin 27 and a wall space 28 between the interior panel 25 and the aircraft skin 27.

The energy harvesting stringer clip 1 is adapted to both secure a thermal insulation blanket 26 in the wall space 28 and generate electrical power from a thermal differential or gradient which exists between opposite sides of the thermal insulation blanket 26 during aircraft flight. While the energy harvesting stringer clip 1 having the particular structure shown in FIGS. 1 and 2 will be described with respect to the invention, it is to be understood that any type of stringer clip or attachment device which is capable of securing a thermal insulation blanket 28, electrical wiring (not shown) or ECS ducting (not shown) within a wall space 28 of an aircraft wall 6 may be adapted to generate electrical power across a thermal gradient according to the principles which will be described below with respect to the energy harvesting stringer clip 1.

Figure 2:
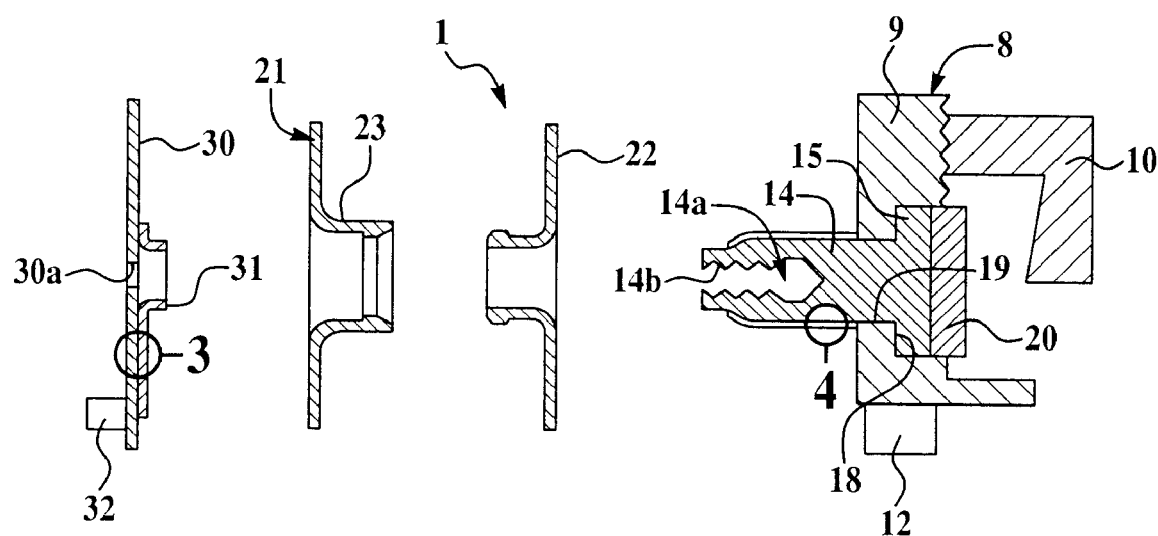
FIG. 2 is an exploded sectional view of the energy harvesting stringer clip shown in FIG. 1.

The energy harvesting stringer clip 1 includes a stringer 2 which is a thermally-conductive material such as metal or thermally-conductive carbon, for example. The stringer 2 includes an attachment segment 3 which is attached to the interior surface of the aircraft skin 27, a spanning segment 4 which extends from the attachment segment 3 and a clip segment 5 which extends from the spanning segment 4. A stringer clip 8, which is a thermally-insulating material such as plastic, for example, is attached to the thermal insulation blanket 26 such as by using a blanket grommet 21, for example. The stringer clip 8 typically includes a clip body 9 and a resilient clip arm 10 which extends from the clip body 9. The blanket grommet 21 may include, for example, an inner grommet subunit 22 which is attached to the clip body 9 of the stringer clip 8 and snap fits into an outer grommet subunit 23, as shown in FIG. 2. As shown in FIG. 1, the inner grommet subunit 22 and the outer grommet subunit 23 extend through a grommet opening (not numbered) in the insulation blanket 26.

As shown in FIG. 2, a base cavity 18 is provided in the clip body 9 of the stringer clip 8. A post 14, which is a thermally-conductive material such as metal, includes a post base 15 which is situated in the base cavity 18. The post 14 extends from the post base 15, through a post opening 19 which extends through the clip body 9 and communicates with the base cavity 18. A thermoelectric device 20 is disposed in thermal contact with the post base 15 of the post 14, with the clip arm 10 of the stringer clip 8 disposed in spaced-apart relationship with respect to the thermoelectric device 20.

As further shown in FIG. 1, a heat exchange washer 30, which is a thermally-conductive material, is provided in thermal contact with the post 14. The heat exchange washer 30 may be attached to the post 14 using any suitable technique which is known to those skilled in the art. According to one suitable attachment technique, which is illustrated in FIG. 2, a fastener cavity 14a, having post threads 14b, extends into the post 14. A fastener opening 30a extends through the heat exchange washer 30. A spring collar 31, which is an electrically-conductive material, extends from the heat exchange washer 30 and surrounds the fastener opening 30a. A threaded washer fastener 33 (FIG. 1) extends through the fastener opening 30a of the heat exchange washer 30 and the blanket grommet 21, respectively, and is threaded into the fastener cavity 14a of the post 14. As shown in FIG. 1, the insulation blanket 26 is anchored to the aircraft skin 27 by inserting the clip segment 5 of the stringer 2 between the thermoelectric device 20 and the clip arm 10 of the stringer clip 8, with the clip segment 5 of the stringer 2 disposed in thermal contact with the thermoelectric device 20.

As shown in FIG. 1, the insulation blanket 26 divides the wall space 28 into an outboard area 28a which is adjacent to the aircraft skin 27 and an inboard area 28b which is adjacent to the interior panel 25 of the aircraft wall 6. The clip segment 5 of the stringer 2 and the post base 15 of the post 14 are disposed in thermal contact with opposite sides of the thermoelectric device 20. During aircraft flight, the stringer 2 is subjected to temperatures in the outboard area 28a, whereas the heat exchange washer 30 and post 14 are subjected to temperatures in the inboard area 28b. During the cruising phase of aircraft flight, temperatures in the outboard area 28a of the wall space 28 may reach temperatures as low as −30 degrees C., whereas temperatures in the inboard area 28b are approximately 16 degrees C. This translates into a temperature differential of about 45 degrees C. between the outboard area 28a and the inboard area 28b of the wall space 28. Temperature differentials may also exist during other phases of aircraft flight or ground operation. Therefore, a heat flow path is established from the heat exchange washer 30 and through the post 14, the post base 15 and the thermoelectric device 20, respectively, to the clip segment 5 of the stringer 2. In response to the flow of heat through the thermoelectric device 20, the thermoelectric device 20 generates electrical power through the Peltier-Seebeck effect.

Figure 3:
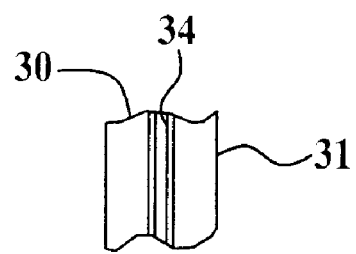
FIG. 3 is an enlarged sectional view, taken along section line 3 in FIG. 2.
Figure 4:
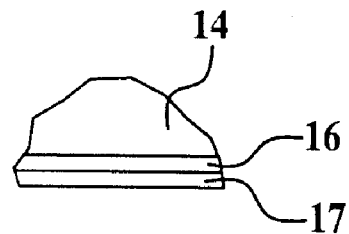
FIG. 4 is an enlarged sectional view, taken along section line 4 in FIG. 2.

FIGS. 2-4 illustrate the manner in which electrical power can be routed to electrical contacts on both sides of the insulation blanket 26 for convenience in utilizing electrical power from the energy harvesting stringer clip 1 from either side of the insulation blanket 26. As shown in the enlarged sectional view of FIG. 4, the post 14 can be coated first with an electrically non-conductive finish or dielectric sleeve 16 and then with an electrically-conductive finish such as a conductive sleeve 17. The post 14 is connected to one polarity of the thermoelectric device 20 (such as the positive pole, for example), while the conductive sleeve 17 is connected to the opposite polarity (negative pole) of the thermoelectric device 20. Therefore, the post 14 carries both polarities through the insulation blanket 26.

The heat exchange washer 30 is typically fastened to the post 14 using the electrically conductive washer fastener 33 (FIG. 1). Thus, the heat exchange washer 30 carries a positive charge, whereas the spring collar 31, which contacts the conductive sleeve 17 (FIG. 4) on the post 14, carries a negative charge. As shown in the enlarged sectional view of FIG. 3, a dielectric coating 34 separates the positively-charged heat exchange washer 30 from the negatively-charged spring collar 31. A non-conductive finish or paper (not shown) may be provided on the bottom side of the heat exchange washer 30 to prevent en electrical short between the heat exchange washer 30 and the spring collar 31.

To provide a convenient electrical interface, fastener holes (not shown) for wire lugs (not shown) can be incorporated into the heat exchange washer 30 and the spring collar 31. Alternatively, an electrical contact block 32 may be electrically connected to the heat exchange washer 30 and spring collar 31 in such a manner that electrical contacts within the contact block 32 can be used as a simple electrical interface. Similar electrical contact blocks 12 can be provided on the stringer clip 8 and/or other components in the outboard area 28a of the wall space 28 and connected to the heat exchange washer 30 and spring collar 31 to provide electrical power to the outboard area 28a of the insulation blanket 26. An energy storage device or sensor (not shown) is connected to each contact block 12 and contact block 32 to receive and store the electrical power. The stored electrical power can be used to power various electrical devices (not shown) such as dimming windows or wireless structural health monitoring devices, for example. Alternatively, the contact block 12 and contact block 32 may be directly connected to the electrical devices for powering of the devices. In typical application, energy harvesting stringer clips 1 are provided in multiple locations on the insulation blanket 26 throughout the fuselage of the aircraft to ensure the adequate supply of electrical power to the electrical devices.

Figure 5:
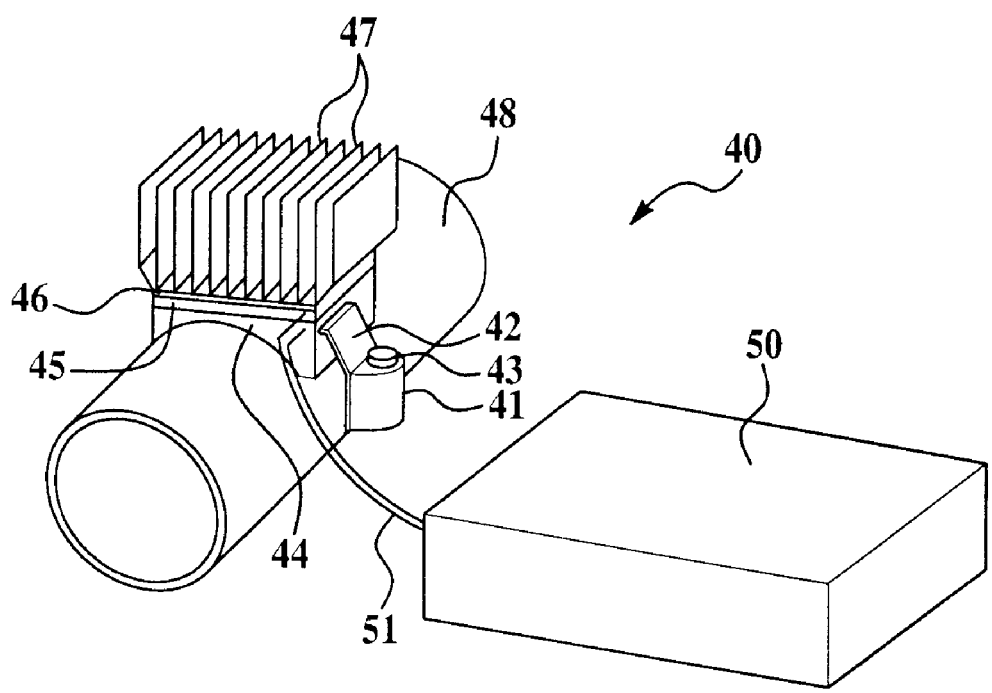
FIG. 5 is a perspective view of an energy harvesting clamp embodiment of the energy harvesting devices.

Referring next to FIG. 5, an illustrative energy harvesting clamp embodiment of the energy harvesting devices is generally indicated by reference numeral 40. The energy harvesting clamp 40 is adapted to generate electrical power from a temperature differential or gradient which exists between a conduit 48, such as a hydraulic tube or ECS duct, for example, and ambient air around the conduit 48. The energy harvesting clamp 40 is particularly suitable for wireless monitoring applications in the wing, tail or landing gear bay of an aircraft, where the addition or retrofit of wires would be difficult. For example, the energy harvesting clamp 40 is well-suited to flight test or health monitoring applications to report the position of an actuator or temperature of a surface without the need to extend a length of wiring to the monitored device.

The energy harvesting clamp 40 typically includes a clamp body 41. A clamp strip 42 is attached to the clamp body 41 by a clamp fastener 43. An adaptor block 44 is attached to the clamp strip 42. The adaptor block 44 is a thermally-conductive material such as metal, metal-impregnated plastic or thermally-conductive carbon, for example. The adaptor block 44 is configured to engage the conduit 48 as the clamp strip 42 secures the adaptor block 44 to the conduit 48. A first surface of a thermoelectric device 45 is provided in thermal contact with the adaptor block 44. A cooling fin base 46, from which extends multiple cooling fins 47, is provided in thermal contact with a second surface of the thermoelectric device 45. An energy storing device 50, such as a battery, for example, is electrically connected to the thermoelectric device 45, typically through wiring 51. Electrical devices (not shown), such as dimming windows or wireless structural health monitoring devices, for example, are connected to the energy storing device 50. Alternatively, the electrical devices may be connected directly to the thermoelectric device 45.

During flow through the conduit 48 of a fluid (not shown) having a temperature which is higher than the ambient air in contact with the cooling fins 47, a heat flow path is established from the walls of the conduit 48 and through the adaptor block 44, the thermoelectric device 45 and the cooling fin base 46, respectively. Heat is dissipated to the ambient air through the cooling fins 47. Thus, as heat flows through the thermoelectric device 45, the thermoelectric device 45 generates electrical power which is stored in the energy storage device 50 and then transmitted to the electrical devices (not shown), or alternatively, transmitted directly to the electrical devices.

During flow through the conduit 48 of a fluid (not shown) having a temperature which is lower than the ambient air in contact with the cooling fins 47, a heat flow path is established from the cooling fins 47 and through the cooling fin base 46, the thermoelectric device 45, the adaptor block 44 and the walls of the conduit 48, respectively. Heat is dissipated to the fluid flowing through the conduit 48. As the heat flows through the thermoelectric device 45, the thermoelectric device 45 generates electrical power which is stored in the energy storage device 50 and then transmitted to the electrical devices (not shown), or alternatively, transmitted directly to the electrical devices.

Figure 6:
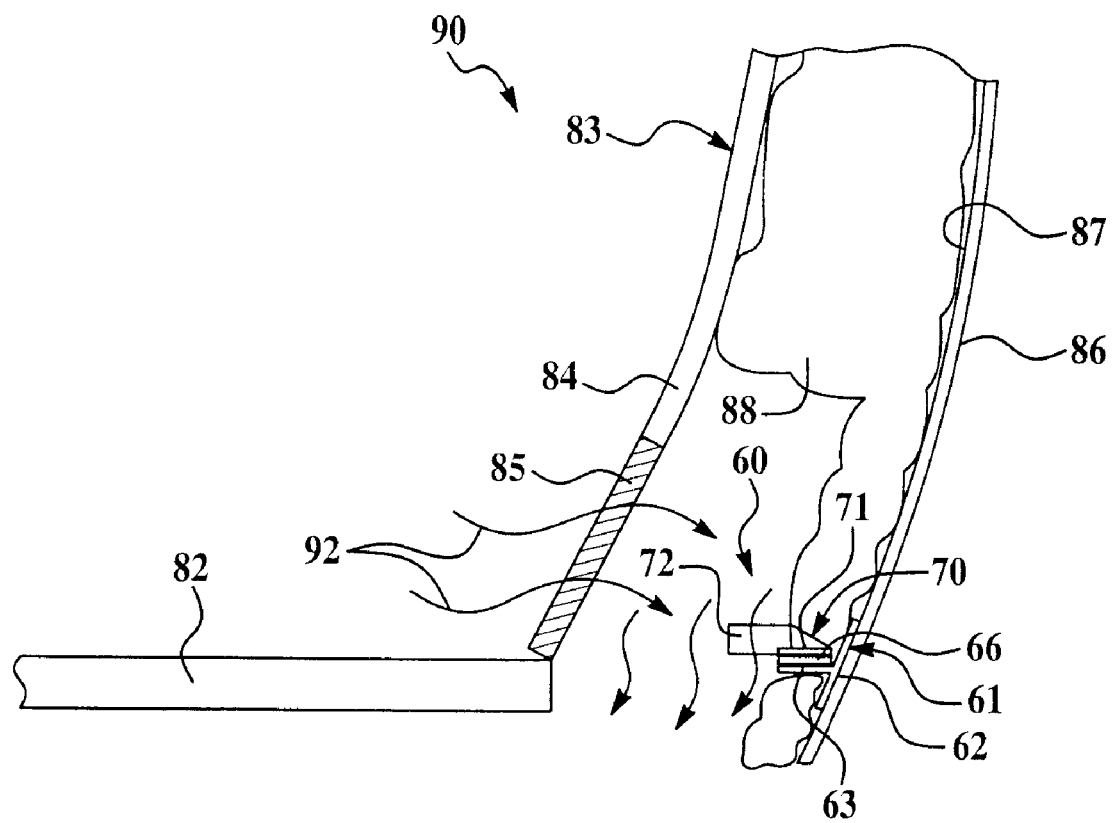
FIG. 6 is a cross-section of a wall portion of an aircraft, with an energy harvesting stringer device attached to an exterior aircraft skin adjacent to a return air vent provided in the interior cabin wall of the aircraft.
Figure 7:
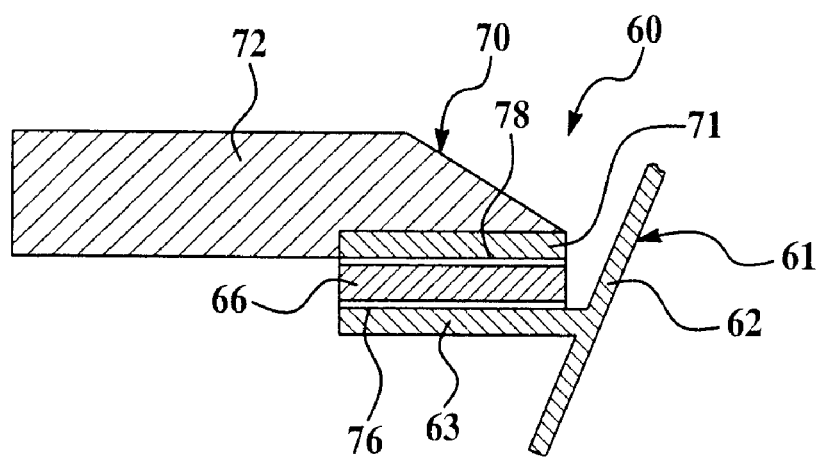
FIG. 7 is a cross-sectional view of the energy harvesting device shown in FIG. 6.

Referring next to FIGS. 6 and 7, an alternative embodiment of the energy harvesting device is generally indicated by reference numeral 60. As shown in FIG. 6 and will be hereinafter described, the energy harvesting device 60 is adapted to be provided in an aircraft wall 83 which extends from a cabin floor 82 of an aircraft. The aircraft wall 83 includes an interior cabin wall portion 84 which encloses an aircraft cabin 90. An exterior aircraft skin portion 86 is disposed in spaced-apart relationship with respect to the interior cabin wall portion 84, with a wall interior 87 defined between the interior cabin wall portion 84 and the exterior aircraft skin portion 86. An insulation blanket 88 is typically provided in the wall interior 87 to restrict heat flow between the aircraft cabin 90 and the exterior aircraft skin portion 86.

Multiple return air vents 85 (one of which is shown in FIG. 6) are provided in the interior cabin wall portion 84 of the aircraft wall 83 throughout various locations of the aircraft. During operation of the aircraft, air 92 flows from the aircraft cabin 90, through the return air vent 85. The air 92 is either exhausted from the aircraft, or is filtered and typically cooled or heated and then returned to the aircraft cabin 90, typically in the conventional manner.

As shown in FIG. 6, the energy harvesting device 60 is provided in thermally-conductive contact with the exterior aircraft skin portion 86 of the aircraft wall 83, in the wall interior 87 and in pneumatic communication with a return air vent 85 in the interior cabin wall portion 84. As shown in FIG. 7, the energy harvesting device 60 includes a crease beam 61. The crease beam 61 is a thermally-conductive material such as aluminum, for example, and includes a base 62 which is disposed in thermally-conductive contact with the interior surface 87 of the exterior aircraft skin portion 86. The base 62 may be attached to the exterior aircraft skin portion 86 using any suitable technique which is known to those skilled in the art, such as using threaded fasteners or rivets (not shown), for example, or in the case of composite materials, for example, carbon fiber, it may be bonded to a composite skin or even formed as an integral part of this skin.

A flange 63 extends from the base 62 of the crease beam 61. A thermoelectric element 66 is disposed in thermally-conductive contact with the flange 63 at a first thermal interface 76. A heat exchanger 70 is disposed in thermal contact with the thermoelectric element 66. The heat exchanger 70 typically includes a heat exchanger plate 71 which is disposed in thermally-conductive contact with the thermoelectric element 66 at a second thermal interface 78. At least one heat exchanger fin 72 extends from the heat exchanger plate 71. Each of the first thermal interface 76 and the second thermal interface 78 may be a thermal epoxy or a thermal interface pad, for example.

As shown in FIG. 6, the energy harvesting device 60 is mounted in the wall interior 87 of the aircraft wall 83 typically by attaching the base 62 to the exterior aircraft skin portion 86 according to the knowledge of those skilled in the art. Accordingly, the at least one heat exchanger fin 72 extends toward the return air vent 85 such that the air 92 which flows from the aircraft cabin 90, through the return air vent 85 and into the wall interior 87 contacts the at least one heat exchanger fin 72. An insulation blanket 88 is typically provided in the wall interior 87, above and below the energy harvesting device 60. The blanket above the energy harvesting device 60 is typically configured to prevent the flow of air so as to force the airflow 92 downward.

During high altitude aircraft flight, the crease beam 61 attains temperatures of typically near −30° C. by dissipation of heat by conduction from the base 62 to the exterior aircraft skin portion 86 of the aircraft wall 83. Air 92 flows into the wall interior 87 through the return air vents 85 and has a temperature of typically about 20° C. Therefore, the thermal gradient between the at least one heat exchanger fin 72 of the heat exchanger 70 and the base 62 of the crease beam 61 is typically about 50° C. The thermoelectric element 66 translates the resulting temperature gradient between the heat exchanger plate 71 of the heat exchanger 70 and the flange 63 of the crease beam 61 into electrical power.

In typical application, multiple energy harvesting devices 60 are positioned adjacent to multiple return air vents 85, respectively, in the interior cabin wall portions 84 of the aircraft wall 83. The thermoelectric elements 68 of the energy harvesting devices 60 may be electrically connected to any of a variety of electronic components of the aircraft. For example, the thermoelectric elements 68 of multiple energy harvesting devices 60 may be electrically connected to dimmable passenger windows (not shown) in the aircraft to power the windows. Alternatively, the thermoelectric elements 68 may be electrically connected to an energy storage device (not shown) to store electrical power for application to various devices in the aircraft.

Although this invention has been described with respect to certain exemplary embodiments, it is to be understood that the specific embodiments are for purposes of illustration and not limitation, as other variations will occur to those of ordinary skill in the art.

What is claimed is:

1. An energy harvesting device on an aircraft, comprising:
   an aircraft crease beam, said crease beam comprising a base mounted in a wall interior between an interior cabin wall portion and an exterior aircraft skin portion, said base in thermally conductive contact with an interior surface of said exterior aircraft skin portion, and a flange extending from said base into said wall interior;

a thermoelectric element having a first side disposed in thermally-conductive contact with said flange; and a heat exchanger disposed in thermally-conductive contact with a second side of said thermoelectric element, said heat exchanger adapted to exchange heat with aircraft cabin air when it flows into said wall interior.

2. The energy harvesting device of claim 1 wherein said crease beam comprises aluminum or carbon fiber.

3. The energy harvesting device of claim 1 wherein said heat exchanger comprises a heat exchanger plate disposed in thermally-conductive contact with said thermoelectric device.

4. The energy harvesting device of claim 3 further comprising at least one heat exchanger fin disposed in thermally-conductive contact with said heat exchanger plate.

5. The energy harvesting device of claim 1 further comprising a first thermal interface between said crease beam and said thermoelectric element.

6. The energy harvesting device of claim 5 further comprising a second thermal interface between said heat exchanger and said thermoelectric element.

7. The energy harvesting device of claim 6 wherein said first thermal interface comprises thermal pad, said second thermal interface each comprises thermal epoxy.

8. The method of claim 1 wherein said flange extends from said base at an angle greater than 90 degrees.

9. An energy harvesting system on an aircraft, comprising:
   an aircraft wall having an interior cabin wall portion, an exterior aircraft skin portion spaced-apart with respect to said interior cabin wall portion and a wall interior between said interior cabin wall portion and said exterior aircraft skin portion;
   a return air vent provided in said interior cabin wall portion;
   an aircraft crease beam, said crease beam comprising a base mounted in said wall interior in thermally conductive contact with an interior surface of said exterior aircraft skin portion and a flange extending from said base into said wall interior towards said return air vent;
   a thermoelectric element having a first side disposed in thermally-conductive contact with said flange; and
   a heat exchanger disposed in thermally-conductive contact with a second side of said thermoelectric element, said heat exchanger in pneumatic communication with said return air vent and adapted to exchange heat with aircraft cabin air when it flows through said return air vent and into said wall interior.

10. The energy harvesting system of claim 9 further comprising at least one insulation blanket provided in said wall interior.

11. The energy harvesting device of claim 9 wherein said crease beam comprises aluminum or carbon fiber.

12. The energy harvesting device of claim 9 wherein said heat exchanger comprises a heat exchanger plate disposed in thermally-conductive contact with said thermoelectric device.

13. The energy harvesting device of claim 12 further comprising at least one heat exchanger fin disposed in thermally-conductive contact with said heat exchanger plate.

14. The energy harvesting device of claim 9 further comprising a first thermal interface between said crease beam and said thermoelectric element.

15. The energy harvesting device of claim 14 further comprising a second thermal interface between said heat exchanger and said thermoelectric element.

16. The energy harvesting device of claim 15 wherein said first thermal interface comprises a thermal pad, said second thermal interface comprises thermal epoxy.

17. The method of claim 9 wherein said flange extends from said base at an angle greater than 90 degrees.

18. A method of harvesting electrical power on an aircraft, comprising:
   providing an aircraft wall having an interior cabin wall portion, an exterior aircraft skin portion spaced-apart with respect to said interior cabin wall portion, a wall interior between said interior cabin wall portion and said exterior aircraft skin portion and at least one return air vent provided in said interior cabin wall portion;
   providing a heat exchanger in pneumatic communication with said at least one return air vent;
   providing a thermoelectric element having a second side in thermally-conductive contact with said heat exchanger;
   providing an aircraft crease beam in thermally-conductive contact with a first side of said thermoelectric element and said exterior aircraft skin portion of said aircraft wall, said crease beam comprising a base mounted in said wall interior in thermally conductive contact with an interior surface of said exterior aircraft skin portion and a flange extending from said base into said wall interior towards said return air vent;
   flowing aircraft cabin air through the return air vent and into the wall interior;
   exchanging heat from the aircraft cabin air through the heat exchanger to the second side of the thermoelectric element;
   conducting heat from the first side of the thermoelectric element through the crease beam to the exterior aircraft skin portion; and
   generating electrical power from the thermoelectric element.

19. The method of claim 18 wherein said heat exchanger comprises a heat exchanger plate and at least one heat exchanger fin disposed in thermally-conductive contact with said heat exchanger plate, and wherein said providing a thermoelectric element in thermally-conductive contact with said heat exchanger comprises providing said thermoelectric element in thermally-conductive contact with said heat exchanger plate.

20. The method of claim 18 wherein said flange extends from said base at an angle greater than 90 degrees.

* * * * *